(12) United States Patent
Lee et al.

(10) Patent No.: US 10,466,530 B2
(45) Date of Patent: Nov. 5, 2019

(54) COLOR CONVERSION ELEMENT AND DISPLAY DEVICE INCLUDING THE SAME

(71) Applicant: SAMSUNG DISPLAY CO., LTD., Yongin-si, Gyeonggi-do (KR)

(72) Inventors: June Woo Lee, Yongin-si (KR); Ji Hyun Kim, Yongin-si (KR); Young Hee Lee, Yongin-si (KR); Young Joo Jeon, Yongin-si (KR); Byoung Seong Jeong, Yongin-si (KR); Jung Ho Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/866,700

(22) Filed: Jan. 10, 2018

(65) Prior Publication Data

US 2019/0049779 A1    Feb. 14, 2019

(30) Foreign Application Priority Data

Aug. 8, 2017 (KR) .................. 10-2017-0100229

(51) Int. Cl.
*H01L 27/00* (2006.01)
*G02F 1/1335* (2006.01)
(Continued)

(52) U.S. Cl.
CPC ....... *G02F 1/133514* (2013.01); *G02B 5/201* (2013.01); *G02B 5/22* (2013.01);
(Continued)

(58) Field of Classification Search
CPC ............ H01L 27/322; H01L 27/14621; H01L 27/3211; H01L 27/3206; H01L 27/3216; H01L 27/3218; G02F 1/133514
See application file for complete search history.

(56) References Cited

U.S. PATENT DOCUMENTS

2003/0107314 A1   6/2003  Urabe et al.
2004/0066363 A1*  4/2004  Yamano .................. G09G 3/20
                                                          345/98

(Continued)

FOREIGN PATENT DOCUMENTS

CN    1776467 A    5/2006
EP    2 824 709 A2  5/2014
(Continued)

OTHER PUBLICATIONS

European Search Report EP 18162429.7 dated Dec. 17, 2018.

*Primary Examiner* — Ngan V Ngo
(74) *Attorney, Agent, or Firm* — Lewis Roca Rothgerber Christie LLP

(57) ABSTRACT

A color conversion element includes a base substrate, and a first color filter layer, a second color conversion layer, and a third color conversion layer disposed on the base substrate, wherein the first color filter layer, the second color conversion layer, and the third color conversion layer are sequentially arranged on a plane, and wherein an interval between the first color filter layer and the second color conversion layer or an interval between the first color filter layer and the third color conversion layer is different from an interval between the second color conversion layer and the third color conversion layer.

9 Claims, 9 Drawing Sheets

(51) Int. Cl.
  *G02B 5/20* (2006.01)
  *G02B 5/22* (2006.01)
  *H01L 27/32* (2006.01)
  *G02F 1/00* (2006.01)
  *H01L 27/146* (2006.01)
  *H01L 51/50* (2006.01)

(52) U.S. Cl.
  CPC ...... *G02F 1/0063* (2013.01); *G02F 1/133617* (2013.01); *G02F 1/133621* (2013.01); *H01L 27/14621* (2013.01); *H01L 27/322* (2013.01); *H01L 27/3206* (2013.01); *H01L 27/3211* (2013.01); *H01L 27/3216* (2013.01); *H01L 27/3218* (2013.01); *H01L 51/502* (2013.01); *H01L 51/5036* (2013.01); *H01L 51/5056* (2013.01)

(56) References Cited

U.S. PATENT DOCUMENTS

| | | | | |
|---|---|---|---|---|
| 2006/0098316 A1* | 5/2006 | Tatsuzawa | ........ | G02F 1/133516 359/891 |
| 2007/0075627 A1* | 4/2007 | Kimura | ........ | H01L 27/3213 313/503 |
| 2011/0227963 A1* | 9/2011 | Su | ........ | G09G 3/3208 345/690 |
| 2012/0038267 A1* | 2/2012 | Hanamura | ........ | H01L 27/322 313/504 |
| 2012/0200222 A1* | 8/2012 | Takagi | ........ | G02B 5/201 313/512 |
| 2012/0206066 A1* | 8/2012 | Takagi | ........ | G02B 5/201 315/312 |
| 2012/0314163 A1* | 12/2012 | Joo | ........ | G02F 1/13394 349/106 |
| 2013/0153883 A1* | 6/2013 | Kurata | ........ | H01L 27/3211 257/40 |
| 2015/0028309 A1 | 1/2015 | Ono et al. | | |
| 2015/0349285 A1* | 12/2015 | Seo | ........ | H01L 51/5044 257/40 |
| 2016/0005790 A1* | 1/2016 | Li | ........ | H01L 27/156 257/89 |
| 2016/0035795 A1* | 2/2016 | Lim | ........ | H01L 27/322 257/40 |
| 2016/0071894 A1* | 3/2016 | Lee | ........ | H01L 27/14621 348/222.1 |
| 2016/0071895 A1* | 3/2016 | Lee | ........ | H01L 27/14627 348/222.1 |
| 2017/0059928 A1* | 3/2017 | Kim | ........ | G02F 1/133514 |
| 2017/0102581 A1* | 4/2017 | Peng | ........ | G02F 1/134309 |
| 2017/0287882 A1* | 10/2017 | Cok | ........ | H01L 25/0753 |
| 2018/0151628 A1* | 5/2018 | Park | ........ | H01L 27/3206 |
| 2018/0188593 A1* | 7/2018 | Kim | ........ | G02F 1/133514 |
| 2018/0331316 A1 | 11/2018 | Lee et al. | | |
| 2019/0027530 A1* | 1/2019 | Chiu | ........ | H01L 21/266 |

FOREIGN PATENT DOCUMENTS

| | | |
|---|---|---|
| JP | 2003-86358 A | 3/2003 |
| JP | WO 2013-154133 A1 | 12/2015 |
| KR | 10-2009-0036373 A | 4/2009 |
| KR | 10-2017-0008591 A | 1/2017 |
| KR | 10-2017-0043724 A | 4/2017 |
| KR | 10-2018-0125673 A | 11/2018 |
| WO | WO 2011/027712 A1 | 3/2011 |
| WO | WO 2017/005021 A1 | 1/2017 |

* cited by examiner

COLOR CONVERSION ELEMENT AND DISPLAY DEVICE INCLUDING THE SAME

CROSS-REFERENCE TO RELATED APPLICATION

Korean Patent Application No. 10-2017-0100229, filed on Aug. 8, 2017, in the Korean Intellectual Property Office, and entitled: "Color Conversion Element and Display Device Including the Same," is incorporated by reference herein in its entirety.

BACKGROUND

1. Field

The present disclosure relates to a color conversion element and a display device including the same.

2. Description of the Related Art

A display device may include a color conversion element for receiving light from a light source, e.g., an organic light emitting element or the like, and implementing a color. The color conversion element may be disposed on a display device in the form of a separate substrate or may be integrated directly with elements in the display device.

As an example, the color conversion element may receive blue light from a light source and emit blue light, green light, and red light, respectively, thereby allowing an image having various colors to be viewed. In this case, a region expressing a blue color in the color conversion element may be configured to emit the blue light provided by the light source as it is.

SUMMARY

According to an aspect of embodiments, a color conversion element may include a base substrate, and a first color filter layer, a second color conversion layer, and a third color conversion layer disposed on the base substrate, wherein the first color filter layer, the second color conversion layer, and the third color conversion layer are sequentially arranged on a plane, and wherein an interval between the first color filter layer and the second color conversion layer or an interval between the first color filter layer and the third color conversion layer is different from an interval between the second color conversion layer and the third color conversion layer.

The first color filter layer, the second color conversion layer, and the third color conversion layer may correspond to regions emitting first, second, and third colors, respectively, the first, second, and third colors being blue, green, and red colors, respectively.

The first color filter layer may contain a scattering agent.

The first color filter layer may contain at least one of a pigment having a first color and a dye having the first color.

The second color conversion layer and/or the third color conversion layer may include a first color cutting layer, and a color conversion medium layer on the first color cutting layer.

The color conversion medium layer may contain a quantum dot.

An area of the first color filter layer overlapping the base substrate may be different from an area of the second color conversion layer or the third color conversion layer overlapping the base substrate.

An area of the first color filter layer contacting the base substrate may be different from an area of the second color conversion layer or the third color conversion layer contacting the base substrate.

A part of the first color filter layer may be on the second color conversion layer to overlap a part of the second color conversion layer.

The color conversion element may further include a light blocking member among the first color filter layer, the second color conversion layer, and the third color conversion layer.

According to an aspect of embodiments a color conversion element may include a plurality of light transmitting layers including a first color region, a second color region, and a third color region, which are spaced apart from each other, a light blocking region in a space among the plurality of light transmitting layers, and a first color filter layer at least partially in the first color region, wherein the first color region includes a first region and a second region, the first region being a region where the first color filter layer is disposed, and the second region being a region where the first color filter layer is not disposed.

The first color filter layer may contain a scattering agent.

The e first color filter layer may contain at least one of a pigment having a first color and a dye having the first color.

The color conversion element may further include a second color conversion layer and/or a third color conversion layer respectively in the second color region and/or the third color region.

The second color conversion layer and/or the third color conversion layer may include a first color cutting layer, and a color conversion medium layer on the first color cutting layer.

According to an aspect of embodiments, a display device may include a light emitting element in which a plurality of pixels are defined, and a color conversion element including a color filter layer and color conversion layers on the light emitting element to correspond to the plurality of pixels, wherein at least a part of a light emitted from the light emitting element passes through the color conversion element without passing through the color filter layer and the color conversion layers.

The color conversion element may define a first color region, a second color region, and a third color region spaced apart from each other, and a light blocking region which fills a gap therebetween, the color filter layer and color conversion layers may include a first color filter layer, a second color conversion layer, and a third color conversion layer, which are disposed in the first, second, and third color regions, respectively, and the first color filter layer may be only in a part of the first color region, a part of a light emitted from the light emitting element being transmitted through a region of the first color region where the first color filter layer is not disposed.

The second color conversion layer may include a color conversion medium layer, and a first color cutting layer on the color conversion medium layer.

A part of the color conversion medium layer may be on the first color filter layer to overlap at least a part of the first color filter layer.

The light emitting element may emit blue light.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
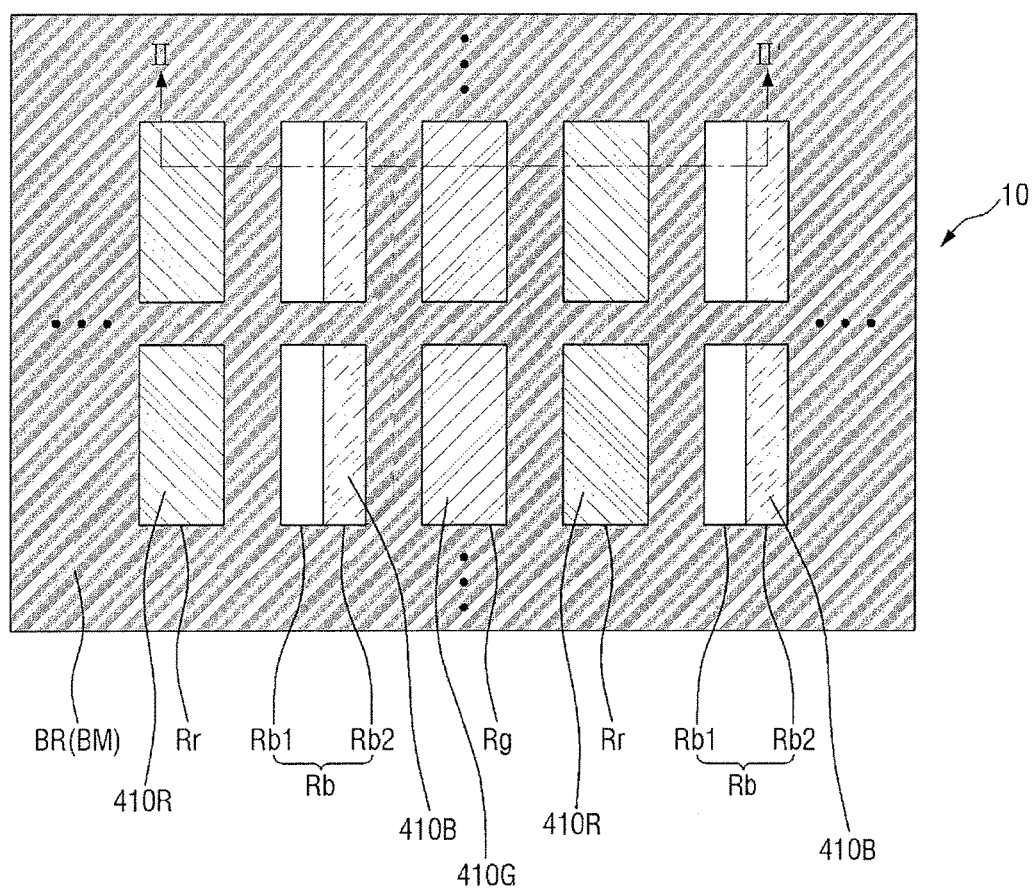
FIG. 1 illustrates a schematic view of a planar shape of a color conversion element according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "connected to" or "coupled to" another layer, it can be directly connected or coupled, or one or more intervening layers may also be present. In addition, it will also be understood that when a layer is referred to as being "between" two layers, it can be the only layer between the two layers, or one or more intervening layers may also be present. In contrast, when an element is referred to as being "directly on," "directly connected to" or "directly coupled to" another element or layer, there are no intervening elements or layers present. As used herein, connected may refer to elements being physically, electrically and/or fluidly connected to each other. Like reference numerals refer to like elements throughout.

The terminology used herein is for the purpose of describing particular embodiments only and is not intended to be limiting. As used herein, the singular forms "a," "an" and "the" are intended to include the plural forms as well, including "at least one," unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof. "At least one" is not to be construed as limiting "a" or "an." "Or" means "and/or." As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below.

Hereinafter, embodiments of the present disclosure will be described with reference to the attached drawings.

Figure 2:
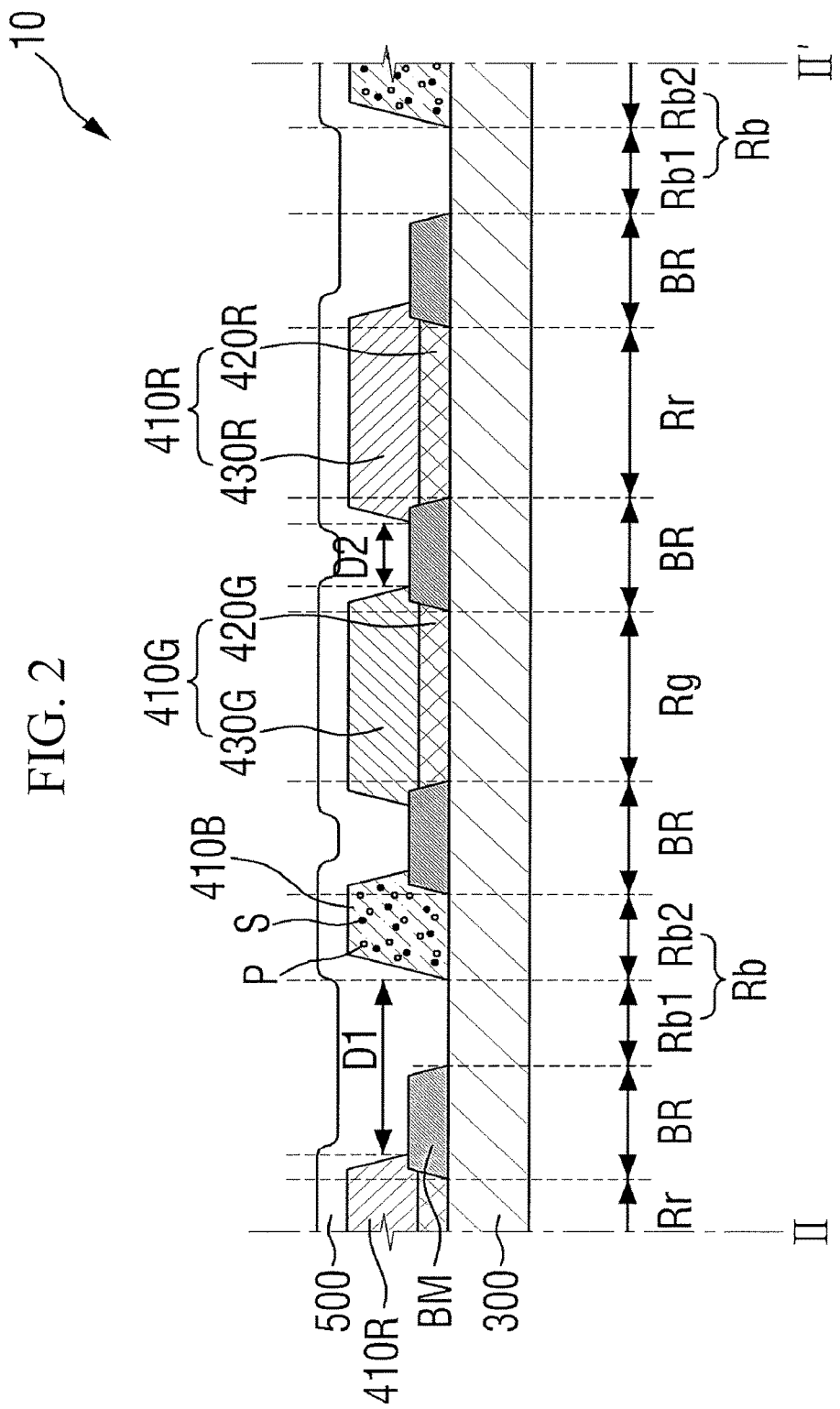
FIG. 2 illustrates a sectional view taken along line I-I' of FIG. 1.

FIG. 1 is a schematic view illustrating a planar shape of a color conversion element 10 according to an embodiment of the present disclosure, and FIG. 2 is a sectional view taken along line II-II' of FIG. 1.

Referring to FIGS. 1 and 2, the color conversion element 10 may include a base substrate 300, a light blocking member BM, a color filter layer 410B, and color conversion layers 410G and 410R. Hereinafter, the color filter layer 410B with the color conversion layers 410G and 410R may be referred to as the color filter and conversion layers 410B, 410G, and 410R. In the color conversion element 10, planar light transmitting regions Rb, Rg, and Rr, and a light blocking region BR are defined depending on the arrangement position of the light blocking member BM.

Figure 3:
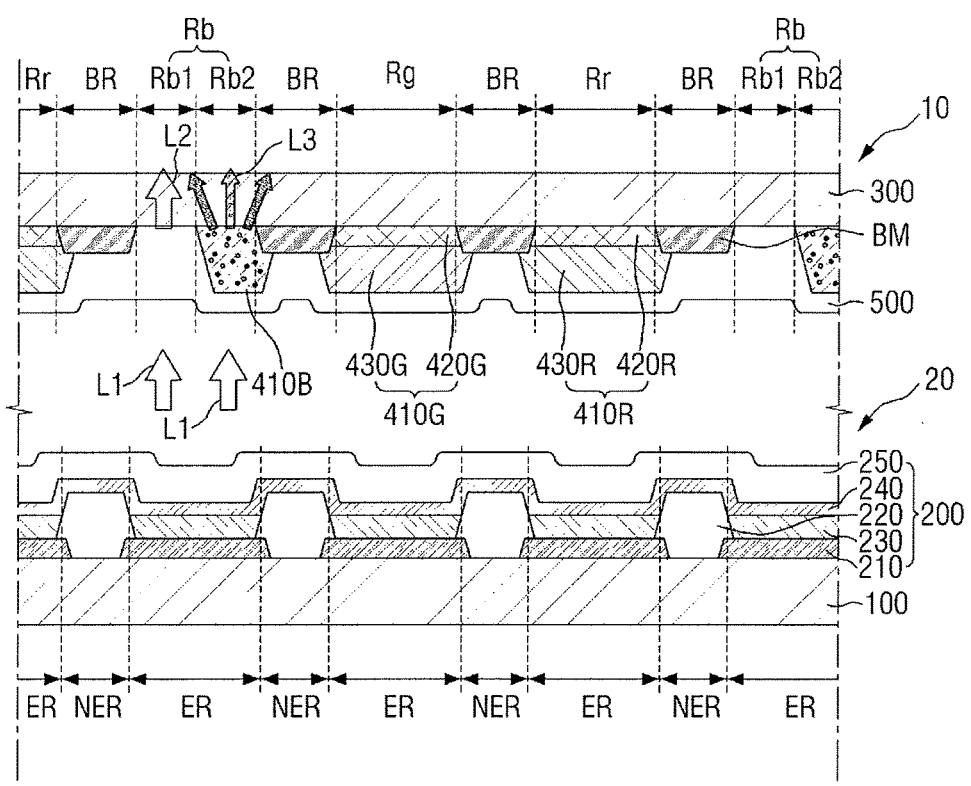
FIG. 3 illustrates a sectional view of a display device according to an embodiment of the present disclosure.

The base substrate 300 may support the components of the color conversion element 10 by providing a space in which the light blocking member BM, the color filter layer 410B, and the like may be disposed. The base substrate 300 may be a light transmitting substrate. The light transmitting regions Rb, Rg, and Rr and light blocking region BR of the color conversion element 10 may be defined on one side of the base substrate 300. In an exemplary embodiment, the color conversion element 10 may be coupled to a display element 20 such that the upper portion thereof faces the display element 20 based on FIG. 2, as illustrated in FIG. 3. In this case, the light provided from the display element 20 may be transmitted from the upper surface of the base substrate 300 to the lower surface thereof based on FIG. 2. That is, as illustrated in FIG. 3, light L1 emitted from the display element 20 may be incident on the color filter and conversion layers 410B, 410G, and 410R of the color conversion element 10 and continue toward and through the base substrate 300.

The light blocking member BM may be disposed on the base substrate 300. A region overlapping with a portion where the light blocking member BM is disposed may be defined as a light blocking region BR, i.e., a region in which the transmission of visible light is substantially blocked, and a region overlapping with a portion where the light blocking member BM is not disposed may be defined as light transmitting regions Rb, Rg, and Rr.

The light blocking member BM may be disposed in a predetermined pattern. For example, the light blocking member BM may have a pattern of a type arranged between adjacent layers of the plurality of color filter and conversion layers 410B, 410G and 410R. Further, as illustrated in FIG. 1, when the plurality of color filter and conversion layers 410B, 410G and 410R are arranged in a matrix shape on a plane, the light blocking members BM may be arranged in a matrix line shape crossing therebetween, e.g., the light blocking members BM may have a pattern of a frame surrounding a grid to separate adjacent color filter and conversion layers 410B, 410G and 410R from each other in two directions.

The light blocking member BM may contain a material having a high absorption rate for visible light. In an exemplary embodiment, the light blocking member BM may contain a metal, e.g., chromium, a metal nitride, a metal oxide, or a resin material colored in black, but the present disclosure is not limited thereto.

The light blocking member BM can prevent color mixing from occurring between the adjacent color filter and conversion layers 410B, 410G, and 410R. Therefore, the light blocking member BM may improve color reproducibility and the like.

The plurality of color filter and conversion layers 410B, 410G, and 410R may be disposed in a region where the light blocking member BM on the base substrate 300 is not disposed. However, the present disclosure is not limited thereto, and some of the color filter and conversion layers 410B, 410G, and 410R may be disposed on the light blocking member BM to overlap a part of the light blocking member BM.

Figure 4:
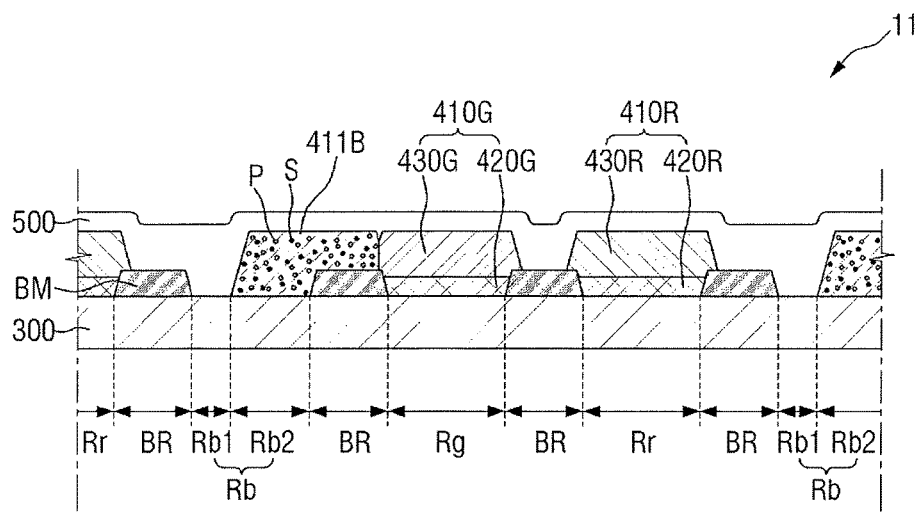
FIGS. 4 to 11 illustrate sectional views of color conversion elements according to other embodiments of the present disclosure.
Figure 5:
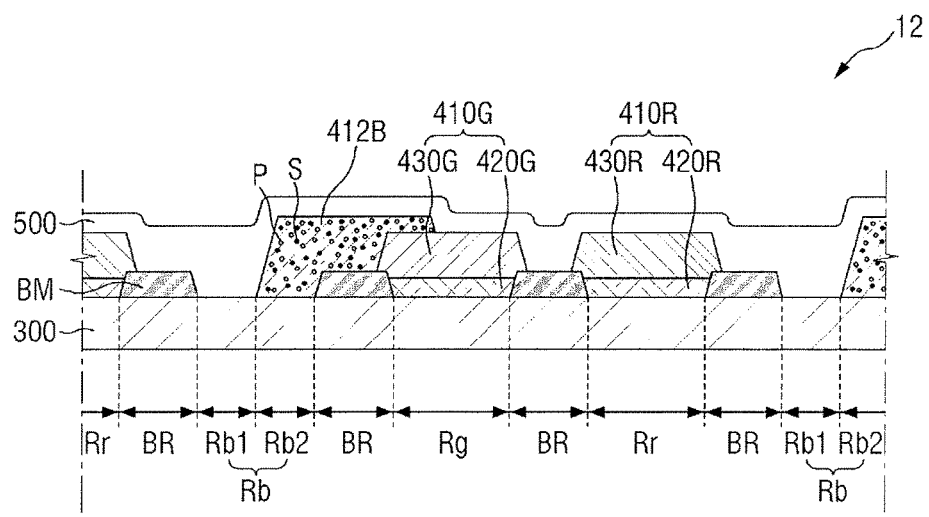
Figure 6:
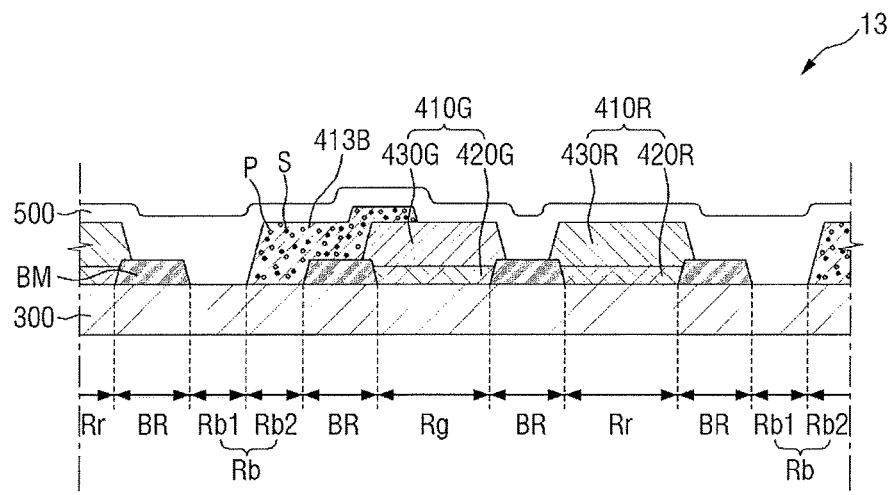

The color filter and conversion layers 410B, 410G, and 410R may be spaced apart from each other by a predetermined distance. However, the present disclosure is not limited thereto. For example, as shown in FIGS. 4 to 6, some of the layers may be disposed to be in contact with each other or overlap each other.

The plurality of color filter and version layers 410B, 410G, and 410R may be divided into a first color filter layer 410B, a second color conversion layer 410G, and a third color conversion layer 410R. The first color filter layer 410B, the second color conversion layer 410G, and the third color conversion layer 410R may be arranged in a predetermined order. In the drawings, the first color filter layer 410B, the second color conversion layer 410G, and the third color conversion layer 410R are arranged in this order in a row direction. However, the arrangement order or arrangement rule of the respective layers is not limited thereto.

The first color filter layer 410B may serve to receive light and emit light of a first color. Specifically, the first color filter layer 410B may be a layer selectively transmitting only the wavelength of the first color of the provided light. In an exemplary embodiment, the light of the first color may be blue light having a wavelength of about 450 nm to 495 nm. However, it should be understood that the blue wavelength is not limited to the above example, and includes all the wavelength ranges that can be perceived as blue in the art.

The first color filter layer 410B may be a layer in which a colorant P having the first color is dispersed in a transparent organic film. The colorant P may be a pigment, a dye, or a mixture thereof. That is, the first color filter layer 410B may be a layer containing at least one of a pigment having the first color and a dye having the first color. However, the present disclosure is not limited thereto, and the first color filter layer 410B may be formed of an organic film having a color transmitting only the wavelength of the first color.

The first color filter layer 410B may further contain a scattering agent S dispersed in the first color filter layer 410B. The scattering agent S may scatter the light incident on the first color filter layer 410B to allow the front and side luminance of the light emitted from the first color filter layer 410B to be uniform, thereby improving the viewing angle of a display device including the color conversion element 10. The scattering agent S is not particularly limited as long as it can uniformly scatter light, and examples thereof may include nanoparticles of $SiO_2$, $TiO_2$, $ZrO_2$, $Al_2O_3$, $In_2O_3$, ZnO, $SnO_2$, $Sb_2O_3$, and ITO. The content of the scattering agent S is not particularly limited, but may be included in an amount of 1 vol % or more of the first color filter layer 410B, e.g., about 1 vol % to about 11 vol %, in order to achieve a substantial light dispersion effect.

Meanwhile, the first color filter layer 410B is not limited to a configuration for filtering a specific wavelength. The first color filter layer 410B may be a light scattering layer in which the scattering agent S is dispersed in a transparent organic film. In this case, the light scattering layer can serve only to uniformly scatter the provided light.

The second color conversion layer 410G may serve to receive light and emit light of a second color. Specifically, the second color conversion layer 410G may be a layer converting the provided light into a wavelength of the second color. In an exemplary embodiment, the light of the second color may be green light having a wavelength of about 495 nm to 570 nm. However, it should be understood that the green wavelength is not limited to the above example, and includes all the wavelength ranges that can be perceived as blue in the art.

The second color conversion layer 410G may include a second color conversion medium layer 430G and a cutting layer 420G. FIG. 2 shows a structure in which a second color conversion medium layer 430G is laminated on the cutting layer 420G.

The second color conversion medium layer 430G may convert the provided light into the second color. The second color conversion medium layer 430G may contain a color conversion material dispersed in the second color conversion medium layer 430G, e.g., a quantum dot (QD), a fluorescent material, or a phosphorescent material.

The quantum dot, which is an example of a color conversion material, is a material having a crystal structure of several nanometers in size, is composed of hundreds to thousands of atoms, and exhibits a quantum confinement effect in which an energy band gap is increased due to a small size. When light having a wavelength higher than the band gap is incident on the quantum dot, the quantum dot is excited by absorbing the light and falls to a ground state while emitting light of a specific wavelength. The emitted light of the specific wavelength has a value corresponding to the band gap. The quantum dot can control the luminescence characteristics due to the quantum confinement effect by adjusting the size and composition thereof.

The quantum dot may contain at least one of group II-VI compounds, group II-V compounds, group III-VI compounds, group III-V compounds, group IV-VI compounds, group compounds, group II-IV-VI compounds, and group II-IV-V compounds. The quantum dot may include a core and a shell overcoating the core. Examples of the core may include, but are not limited to, CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, $Fe_2O_3$, $Fe_3O_4$, Si, and Ge. Examples of the shell may include, but are not limited to, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TIN, TIP, TIAs, TISb, PbS, PbSe, and PbTe.

When light is incident on the color conversion material, and then its wavelength is converted and emitted, its emission direction has random scattering characteristics. Accordingly, the second color conversion layer 410G containing such a color conversion material may have uniform front and side luminance of light emitted from the second color conversion layer 410G even if it does not contain an additional scattering agent. However, the second color conversion layer 410G may further contain the scattering agent S for more uniformly controlling the viewing angle of the emitted light.

The cutting layer 420G may be a layer that blocks the transmission of light of a specific wavelength. As described above, the color conversion element 10 may be coupled with the display element 20 such that the upper portion thereof faces the display element 20 based on FIG. 2. In this case, the light emitted from the display element 20 may be first incident on the second color conversion medium layer 430G, converted into the wavelength of the second color, and then incident on the cutting layer 420G. At this time, a part of the light incident on the second color conversion medium layer 430G may pass through the second color conversion medium layer 430G without passing through the color conversion material. In this case, the cutting layer 420G can block such light to improve the color purity of light emitted from the second color conversion layer 410G.

In an exemplary embodiment, the light emitted from the display element 20 may have a wavelength substantially the same as the first color, and the cutting layer 420G may be a first color cutting layer 420G. The first color cutting layer 420G may be formed of an organic film having a yellow color. However, the present disclosure is not limited thereto, and the first color cutting layer 420G may also be formed of an organic film having a green color. That is, the first color cutting layer 420G may contain any material that can block the first color light.

The third color conversion layer 410R, similarly to the second conversion layer 410G, may serve to receive light and emit light of a third color. Specifically, the third color conversion layer 410R may be a layer converting the provided light into a wavelength of the third color. In an exemplary embodiment, the light of the third color may be red light having a wavelength of about 620 nm to 750 nm. However, it should be understood that the green wavelength is not limited to the above example, and includes all the wavelength ranges that can be perceived as blue in the art.

The third color conversion layer 410R may include a third color conversion medium layer 430R and a cutting layer 420R. Since the third color conversion medium layer 430R and the cutting layer 420R haven been described as described above in the description of the second color conversion layer 410G, a redundant description will be omitted. The third color conversion medium layer 430R may contain a color conversion material such as a quantum dot capable of converting the provided light into a third color. When the cutting layer 420R of the third color conversion layer 410R is a layer blocking the first color, the cutting layer 420R may be formed of an organic film having a red color. However, the present disclosure is not limited thereto, and the cutting layer 420R may be formed of an organic film having a yellow color. In an exemplary embodiment, both the cutting layer 420G of the second color conversion layer 410G and the cutting layer 420R of the third color conversion layer 410R may be organic films having a yellow color, but the present disclosure is not limited thereto.

In the light transmitting regions Rb, Rg and Rr, the region where the first color filter layer 410B is disposed may be defined as a first color region Rb, the region where the second color conversion layer 410G is disposed may be defined as a second color region Rg, and the region where the third color conversion layer 410R is disposed region may be defined as a third color region Rr. The first, second, and third color regions Rb, Rg, and Rr may be regions that receive light and emit first, second, and third color light, respectively.

Although the second color conversion layer 410G and the third color conversion layer 410R are entirely disposed in the second color region Rg and the third color region Rr, respectively, the first color filter layer 410B may be disposed only in a part of the first color region Rb. That is, as illustrated in FIG. 1, the second and third color regions Rg and Rr are filled with the regions where the second or third color conversion layers 410G and 410R are disposed, whereas the first color region Rb may include both the region Rb2 where the first color filter layer 410B is disposed and the region Rb1 where the first color filter layer 410B is not disposed. Therefore, a part of the light incident on the first color region Rb may pass through the first color filter layer 410B, and a remaining part thereof may pass through the color conversion element 10 without passing through the first color filter layer 410B.

Expressing the arrangement relationship between the first color filter layer 410B and the second and third color conversion layers 410G and 410R again, the first color filter layer 410B, second color conversion layer 410G, and the third color conversion layers 410R may be sequentially arranged on a plane. The interval between the first color filter layer 410B and the second color conversion layer 410G or the interval between the first color filter layer 410B and the third color conversion layer 410R may be different from the interval between the second color conversion layer 410G and the third color conversion layer 410R. For example, as illustrated in FIG. 2, the horizontal interval D1 between the first color filter layer 410B and the third color conversion layer 410R may be larger than the horizontal interval D2 between the second and third color conversion layers 410G and 410R due to the small horizontal width of the first color filter layer 410B relative to those of the second and third color conversion layers 410G and 410R, e.g., to allow for the exposed region Rb1 discussed above. Further, the area of the first color filter layer 410B contacting (or overlapping) the base substrate 300 may be different from the area of the second color conversion layer 410G or the third color conversion layer 410R contacting (or overlapping) the base substrate 300, e.g., due to the small horizontal width of the first color filter layer 410B relative to those of the second and third color conversion layers 410G and 410R (FIGS. 1-2).

If the entire light incident on the first color region Rb were to pass through the first color filter layer 410B, the viewing angle and color purity would be improved, but the luminance would be lowered due to the light loss occurring when the light passes through the first color filter layer 410B. On the other hand, if the first color filter layer 410B were not provided, the light incident on the first color region Rb would be emitted to the outside while maintaining luminance, but would be disadvantageous in terms of viewing angle and color purity. That is, luminance and viewing angle/color purity can form a trade-off relationship.

Therefore, improvement of luminance is an important factor in the display device product depending on its size or purpose, and/or improvement of a viewing angle or color purity is an important factor as well. As such, according to embodiments, the first color filter layer 410B is disposed only in a necessary portion of the first color region Rb, thereby setting the balance between the luminance and the viewing angle/color purity to a required level. That is, as discussed previously, the first color region Rb includes the first color filter layer 410B only in one of the regions Rb1 and Rb2 to balance between the luminance and the viewing angle/color purity.

In other words, the first color filter layer 410B, unlike the second or third conversion layer 410G or 410R, may be formed in only a part of the first color region Rb by partially changing the shape of an exposure mask used for forming the second or third color conversion layers 410G or 410R or by adjusting an exposure amount. However, the method of forming the first color filter layer 410B is not limited thereto.

The color conversion element 10 may further include a protective layer 500 disposed to cover the plurality of color filter and conversion layers 410B, 410G, and 410R. The protective layer 500 may serve to seal and protect elements such as the color filter and conversion layers 410B, 410G, and 410R. In particular, since the color conversion material, e.g., a quantum dot, contained in the color conversion thereby setting the balance between the luminance and the viewing angle/color purity to a required level on layers 410G and 410R is vulnerable to oxygen, moisture, or the like, it is possible to effectively protect the components of the color conversion element 10 by forming the protection layer 500 made of a material resistant to moisture. The protective layer 500 may be made of a transparent material that substantially transmits visible light.

FIG. 3 is a sectional view of a display device according to an embodiment of the present disclosure. Referring to FIG. 3, a display device may include the display element 20 and the color conversion device 10 facing the display element 20. Since the color conversion element 10 shown in FIG. 3 is substantially the same as the color conversion element 10 shown in FIGS. 1 and 2, hereinafter, a detailed description of the color conversion device 10 will be omitted.

The display element 20 may include a support substrate 100 and a light emitting element 200. In the display element 20, a plurality of pixels may be defined on a plane.

The support substrate 100 may be a driving substrate including a wiring for driving the display element 20, an electrode, a semiconductor, an insulating film, or the like, which provides a space where the light emitting element 200 is disposed. The light emitting element 200 may include a first electrode 210, a pixel defining layer 220, a light emitting layer 230, and a second electrode 240.

The first electrode 210 may be disposed on the support substrate 100. The first electrode 210 may be disposed in a region corresponding to each pixel of the display element 20. The first electrode 210 may be a pixel electrode or an anode electrode of the display element 20.

The pixel defining layer 220 may be disposed on the support substrate 100. The pixel defining layer 220 may define a plurality of pixels on the display element 20 through openings. The opening may expose at least a part of the first electrode 210 for each pixel.

The light emitting layer 230 may be disposed on the first electrode 210 exposed by the opening. The light emitting layer 230 may be an organic light emitting layer containing an organic material that emits light by the formation of excitons of holes and electrons. In this case, the light emitting element 200 and the display element 20 may be referred to as an organic light emitting element and an organic light emitting display element, respectively. The light emitting layer 230 may further include at least one of a hole injecting layer, a hole transporting layer, an electron transporting layer, and an electron injecting layer.

The second electrode 240 may be disposed on the light emitting layer 230. The second electrode 240 may be disposed to cover both the light emitting layer 230 and the pixel defining layer 220. The second electrode 240 may be a common electrode or cathode electrode of the display element 20.

The display element 20 may further include a capping layer 250 disposed to seal the light emitting device 200 to prevent external foreign matter or moisture from penetrating into the organic layer.

The light emitted from the light emitting layer 230 may pass through the second electrode 240, made of a transparent material, and through the capping layer 250, and may be provided to the front side, i.e., to be incident on the color conversion element 10 disposed on the upper side with reference to FIG. 3. In the display element 20, the region where light is emitted by the light emitting layer 230 may be defined as a light emitting region ER, and the region where the light emitting layer 230 is not disposed may be defined as a non-light emitting region NER.

As described above, as the display element 20, an organic light emitting display element including the organic light emitting layer 230 has been exemplified, but the present disclosure is not limited thereto. The display element 20 may be a liquid crystal display element that selectively transmits light provided from a backlight assembly including a light source and provides the light to the color conversion element 10.

The color conversion element 10 may be disposed such that the base substrate 300 is disposed on the upper side of FIG. 3, so the plurality of color filter and conversion layers 410B, 410G, 410R face the display element 20. The plurality of light transmitting regions Rb, Rg, and Rr of the color conversion element 10 may correspond to the plurality of pixels of the display element 20 at a ratio of 1:1, and the light blocking region BR of the color conversion element 10 may correspond to the non-light emitting region NER of the display element 20. The area of each of the light transmitting regions Rb, Rg and Rr may be substantially the same as the area of the light emitting region ER (or the area of the light blocking region BR and the area of the non-light emitting region NER), but the present disclosure is not limited thereto.

As described above, since the first color is disposed only in a part of the first color region Rb, a first part of the light L1 incident on the first color region Rb may pass through the first color filter layer 410B, and a remaining part thereof, i.e., a second part of light L1 different from the first part, may pass through the color conversion element 10 without passing through the first color filter layer 410B. As described above, light L2 not passing through the first color filter layer 410B is advantageous in teams of luminance, but is disadvantageous in terms of a viewing angle/color purity compared to light L3 passing through the first color filter layer 410B.

The light emitting layer 230 disposed in each pixel may emit light of the same color or wavelength to each other, and more specifically, emit the first color light. However, the present disclosure is not limited thereto, and the first color light emitted from the light emitting layer 230 and the first color light emitted from the first color filter layer 410B may be partially different from each other in a specific wavelength range.

In the first color light emitted from the light emitting layer 230 of the display element 20, the light provided to the first color region Rb of the color conversion element 10 may be emitted to the outside while maintaining the first color, and the light provided to the second and third color regions may be converted into second and third colors through the second and third color conversion layers, respectively, and emitted to the outside. At least a part of the light L2 emitted from the light emitting layer 230 passes through the color conversion element 10 through a region of the first color region Rb where the first color filter layer 410B is not disposed, so that luminance may not be lost. The viewing angle, color purity, and the like of the light L3 passing through the first color filter layer 410B of the first color region Rb can be improved.

In an exemplary embodiment, the first color light may be blue light having a wavelength of about 450 nm to 495 nm, the second color light may be green light having a wavelength of about 495 nm to 570 nm, and the third color light may be red light having a wavelength of about 620 nm to 750 nm. However, the blue, green, and red wavelengths are not limited to the above examples, and should be understood to include all wavelength ranges that can be recognized in the art as blue, green, and red.

FIG. 4 is a sectional view of a color conversion element 11 according to another embodiment of the present disclosure. The color conversion element 11 of FIG. 4 is the same as the color conversion element 10 of FIGS. 1 and 2, except that the first color filter layer 411B is disposed in substantially the same size as the second color conversion layer 410G or the third color conversion layer 410R. Hereinafter, redundant contents will be omitted, and differences will be mainly described.

Referring to FIG. 4, the first color filter layer 411B may be disposed in substantially the same size as the second color conversion layer 410G or the third color conversion layer 410R. That is, the planar area of the first color filter layer 411B may be substantially the same as that of the second color conversion layer 410G or the third color conversion layer 410R, as viewed in top view.

In this case, the area of the first color filter layer 410B contacting the base substrate 300 may be different from the area of the second color conversion layer 410G or the third color conversion layer 410R contacting the base substrate 300, but the area of the first color filter layer 410B overlapping the base substrate 300 may be the same as the area of the second color conversion layer 410G or the third color conversion layer 410R overlapping the base substrate 300. Accordingly, the color conversion element 11 may have a shape in which the first color filter layer 410B having the same size as the second and third color conversion layers 410G and 410R is shifted in one direction.

The first color filter layer 411B having such a shape can be formed by simply changing the alignment of an exposure mask used for forming the second and third color conversion layers 410G and 410R by a predetermined interval in addition to the above-mentioned method.

Further, the first color filter layer 411B may be disposed to be in contact with the adjacent color conversion layers 410G and 410R. FIG. 4 shows a case where the first color filter layer 411B is disposed to be in contact with the second color conversion layer 410G of the adjacent color conversion layers 410G and 410R. However, the present disclosure is not limited thereto, and the first color filter layer 411B may be disposed to be in contact with the third color conversion layer 410R which is an adjacent color conversion layer located on the opposite side of the second color conversion layer 410G.

FIGS. 5 and 6 are sectional views of color conversion elements 12 and 13 according to other embodiments of the present disclosure. Each of the color conversion elements 12 and 13 of FIGS. 5 and 6 is the same as the color conversion element 10 of FIGS. 1 and 2, except that a part of each of the first color filter layers 412B and 413B is disposed on the adjacent color conversion layer 410G to overlap at least a part of the color conversion layer 410G. Hereinafter, redundant contents will be omitted, and differences will be mainly described.

Referring to FIGS. 5 and 6, a part of each of the first color filter layers 412B and 413B may be disposed on the adjacent color conversion layer 410G to overlap at least a part of the color conversion layer 410G. FIGS. 5 and 6 shows a case where each of the first color filter layers 412B and 413E overlaps the second color conversion layer 410G of the adjacent color conversion layers 410G and 410R. However, the present disclosure is not limited thereto, and each of the first color filter layers 412B and 413B may be disposed on the third color conversion layer 410R to overlap the third color conversion layer 410R which is an adjacent color conversion layer located on the opposite side of the second color conversion layer 410G.

FIG. 5 shows a case where the first color filter layer 412B is disposed in an overall higher shape than the second color conversion layer 410G. For example, the first color filter layer 412B may have a larger thickness than the second color conversion layer 410G, and may partially overlap a top surface of the second color conversion layer 410G.

FIG. 6 shows a case where only the portion of the first color filter layer 413B disposed on the second color conversion layer 410G is disposed to protrude upwards. For example, the first color filter layer 413B may have a first top surface level with that of the second color conversion layer 410G, and a second top surface partially overlapping the top surface of the second color conversion layer 410G.

The light emitted from the display element 20 may be applied toward each of the color conversion elements 12 and 13 from above of FIGS. 5 and 6 (refer to FIG. 3), and a part of the light may be incident on a region where each of the first color filter layers 412B and 413B overlaps the second color conversion layer 410G. However, since the light having passed through each of the first color filter layers 412B and 413B in the region is finally converted into the second color light while passing through the second color conversion layer 410G, the realization of a desired color of each of the color conversion elements 12 and 13 is not influenced.

Figure 7:
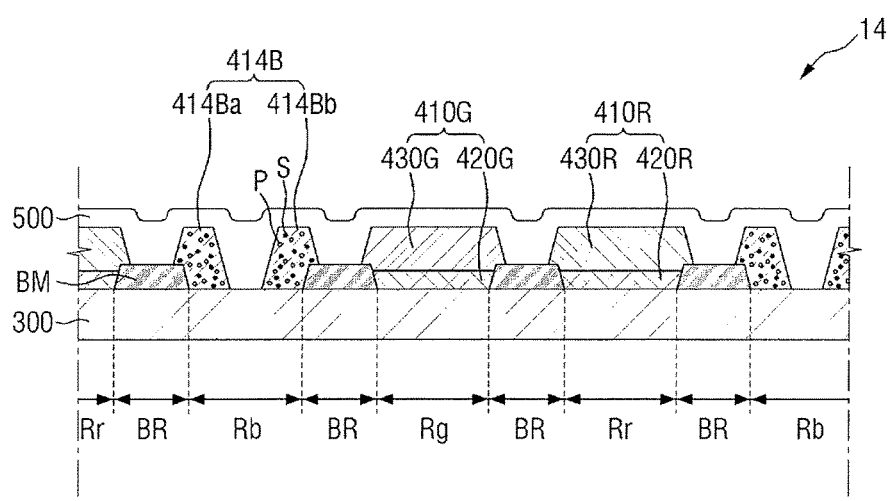
Figure 8:
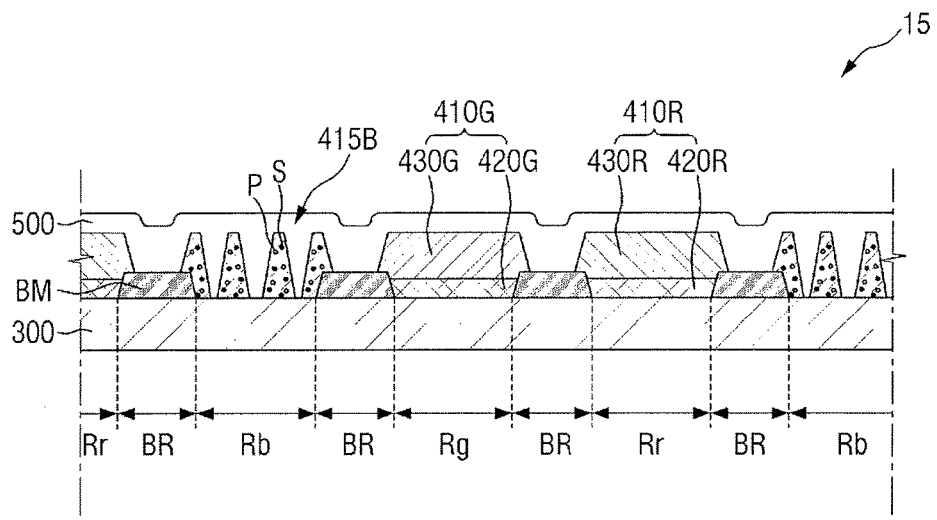

FIGS. 7 and 8 are sectional views of color conversion elements 14 and 15 according to other embodiments of the present disclosure. Each of the color conversion elements 14 and 15 of FIGS. 7 and 8 is the same as the color conversion element 10 of FIGS. 1 and 2, except that each of the first color filter layers 414B and 415B includes a plurality of sub-filter layers. Hereinafter, redundant contents will be omitted, and differences will be mainly described.

Referring to FIG. 7, the first color filter layer 414B may include sub-filter layers 414Ba and 414Bb disposed on both sides of the first color region Rb or on the rim of the first color region Rb. Further, the first color filter layer 415B may include a plurality of sub-filter layers arranged in a slit shape as shown in FIG. 8. As described above, in a region where the sub-filter layers are not arranged, light can pass through each of the color conversion elements 14 and 15 without loss of luminance, and in a region where the sub-filter layers are arranged, the viewing angle and/or color purity of light can be improved. The balance between luminance and viewing angle/color purity can be set to a desired level by adjusting the shape, size and number of the sub-filter layers.

Figure 9:
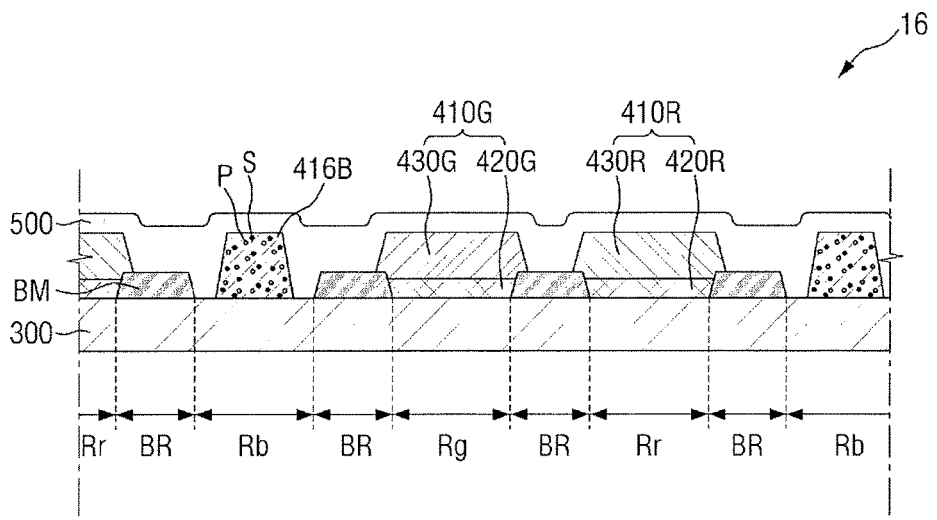

FIG. 9 is a sectional view of a color conversion element 16 according to another embodiment of the present disclosure. The color conversion element 16 of FIG. 9 is the same as the color conversion element 10 of FIGS. 1 and 2, except that the first color filter layer 416B is disposed in the first color region Rb in an island shape. Hereinafter, redundant contents will be omitted, and differences will be mainly described.

Referring to FIG. 9, the first color filter layer 416B may be disposed in the first color region Rb in an island shape. In this case, the first color filter layer 416B may be disposed to be spaced apart from the light blocking member BM without being in contact with the light blocking member BM. In this case, a part of the light incident on the first color region Rb may pass through the first color filter layer 416B, and the remaining light may transmit the portion where the first color filter layer 416B is not disposed.

Figure 10:
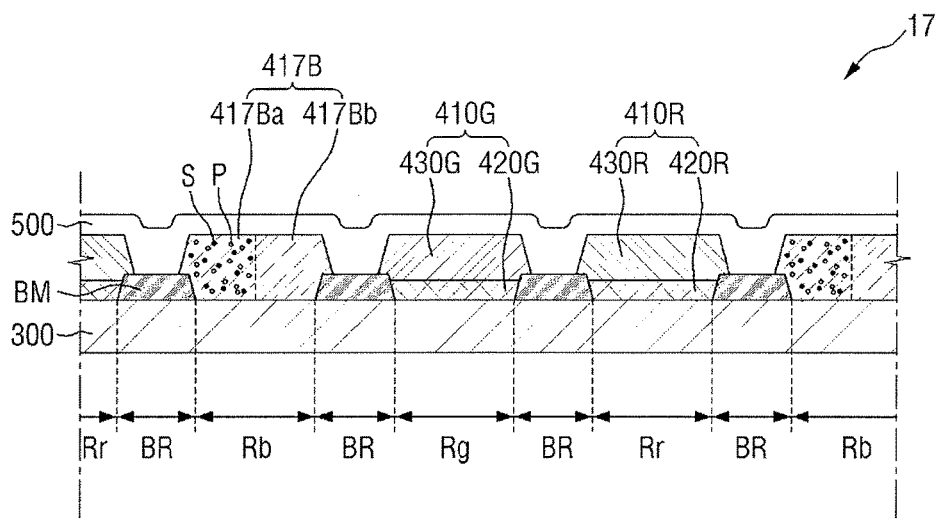

FIG. 10 is a sectional view of a color conversion element 17 according to another embodiment of the present disclosure. The color conversion element 17 of FIG. 10 is the same as the color conversion element 10 of FIGS. 1 and 2, except that the scattering agent S and/or the colorant P is contained only in a part of the first color filter layer 417B. Hereinafter, redundant contents will be omitted, and differences will be mainly described.

Referring to FIG. 10, the first color filter layer 417B may be formed of a transparent organic film, and may include a first portion 417Ba in which the scattering agent S and/or the colorant P is dispersed, and a second portion 417Bb which does not contain the scattering agent S and the colorant P. The first portion 417Ba and the second portion 417Bb may have a horizontal positional relationship with respect to each other with reference to FIG. 10.

The light incident on the first portion 417Ba of the first color filter layer 417B can be improved in viewing angle/color purity as described above, and the light incident on the second portion 417Bb of the first color filter layer 417B can be maintained in luminance because it passes through only the transparent organic film. In this case, the first color filter layer 417B may be disposed over the entire first color region Rb, but the present disclosure is not limited thereto.

Figure 11:
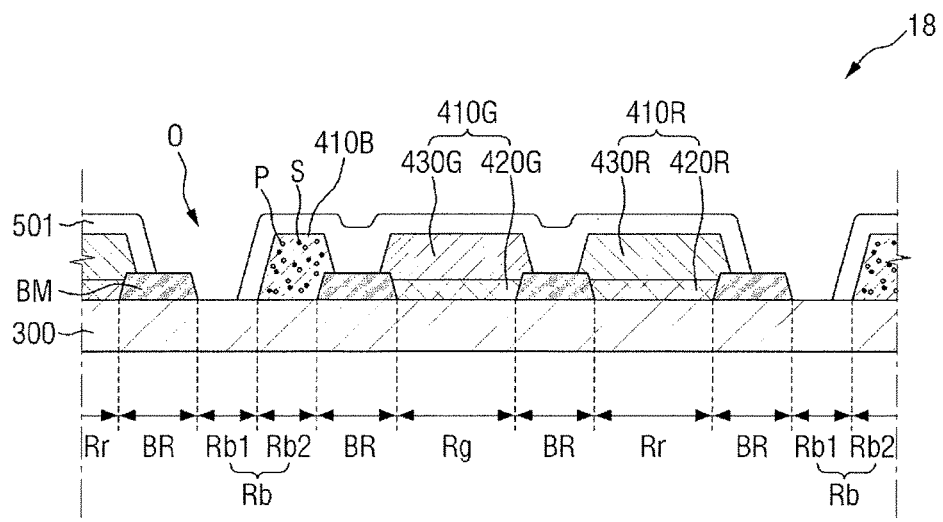

FIG. 11 is a sectional view of a color conversion element 18 according to another embodiment of the present disclosure. The color conversion element 18 of FIG. 11 is the same as the color conversion element 10 of FIGS. 1 and 2, except that an opening O is defined in a portion of the first color region Rb where the first color filter layer 410B is not disposed. Hereinafter, redundant contents will be omitted, and differences will be mainly described.

Referring to FIG. 11, a portion in which the protective layer 501 is not disposed, that is, an opening O of the protective layer 501, may be defined in the portion of the first color region Rb where the first color filter layer 410B is not disposed. Therefore, the light incident on the portion of the first color region Rb where the first color filter layer 410B is not disposed may not pass through the protective layer, so that the loss of luminance can be further reduced.

Figure 12:
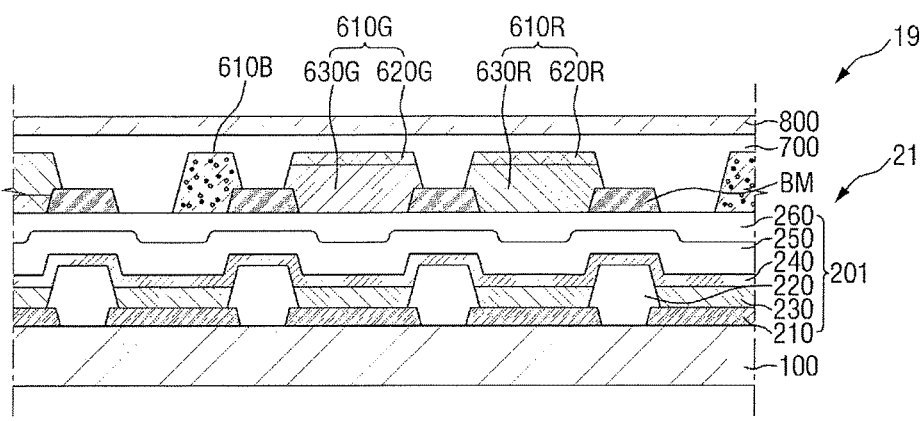
FIG. 12 illustrates a sectional view of a display device according to another embodiment of the present disclosure.

FIG. 12 is a sectional view of a display device according to another embodiment of the present disclosure. The display device of FIG. 12 is the same as the display device of FIG. 3, except that a color conversion element 19 is directly disposed on a display element 21. Hereinafter, redundant contents will be omitted, and differences will be mainly described.

Referring to FIG. 12, unlike the display device of FIG. 3 in which the color conversion element 10 is disposed on the display element 20 as a separate substrate, the color conversion element 19 is directly disposed on a planarization film 260 covering the display element 21. However, the present disclosure is not limited thereto, and the upper surface of the capping layer 250 may be formed flat without a separate planarization layer 260, so that the color conversion element 19 may be directly formed on the capping layer 250.

The light blocking member BM and filter layer and color conversion layers 610B, 610G, and 610R of the color conversion element 19 may be disposed on the upper surface of the planarization film 260 (or capping layer 250) of the display element 21 using the upper surface thereof as a base surface. In this case, the light emitted from the display element 21 may be incident from the lower portion of the color conversion element 19 with reference to FIG. 12. Therefore, each of the second and third color conversion layers 610G and 610R may have a structure in which the cutting layer 620G or 620R is laminated on a second or third color conversion medium layer 630G or 630R.

A sealing substrate 800 may be further disposed on the protective layer 700 of the color conversion element 19. The sealing substrate 800 may be a light transmitting substrate. However, the sealing substrate 800 may be omitted in some cases.

Figure 13:
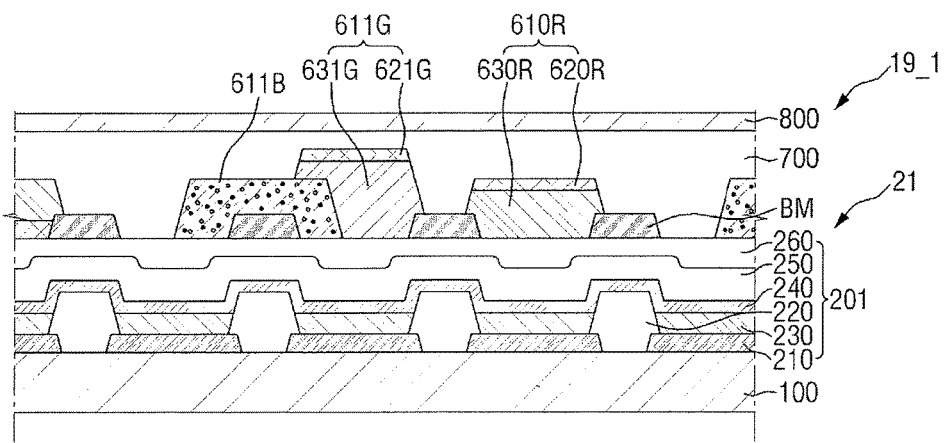
FIGS. 13 and 14 illustrate sectional views of color conversion elements according to other embodiments of the present disclosure.
Figure 14:
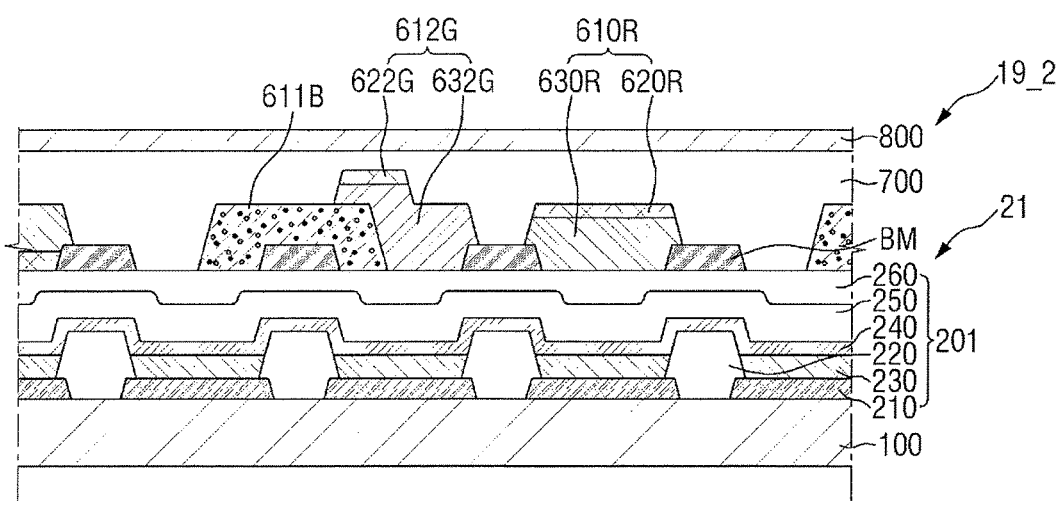

FIGS. 13 and 14 are sectional views of color conversion elements 19_1 and 19_2 according to other embodiments of the present disclosure. The color conversion element 19_1 of FIG. 13 is the same as the color conversion element 19 of FIG. 19, except that a part of a color conversion layer 611G adjacent to the first color filter layer 611B is disposed on the first color filter layer 611B so as to overlap at least a part of the first color conversion layer 611B. Hereinafter, redundant contents will be omitted, and differences will be mainly described.

Referring to FIGS. 13 and 14, a part of each of the color conversion layers 611G and 612G adjacent to the first color filter layer 611B may be disposed on the first color filter layer 611B so as to overlap at least a part of the first color filter layer 611B. Specifically, each of the color conversion medium layers 631G and 632G in the color conversion layers 611G and 612G may be disposed on the first color filter layer 611B. FIGS. 13 and 14 show a case where a part of each of the second color conversion layers 611G and 612G in adjacent color conversion layers overlaps the first color filter layer 611B. However, the present disclosure is not limited thereto, and a part of the third color conversion layer 610R which is an adjacent color conversion layer located at the opposite side of each of the second color conversion layers 611G and 612G may be disposed to overlap the first color filter layer 611B.

FIG. 13 shows a case where the second color conversion layer 611G is disposed in an overall higher shape than the first color filter layer 611B, and FIG. 14 shows a case where only the portion of the second color conversion layer 612G disposed on the first color filter layer 611B is disposed to protrude upwards.

The light emitted from the display element 21 may be applied toward the color conversion element 19 from below of FIGS. 13 and 14 (refer to FIG. 12), and a part of the light may be incident on a region where the first color filter layer 611B overlaps each of the second color conversion layer 611G and 612G. However, since the light having passed through the first color filter layer 611B in the region is finally converted into the second color light while passing through each of the second color conversion layer 611G and 612G, particularly each of the second color conversion medium layers 631G and 632G, the realization of a desired color of the color conversion element 19 is not influenced.

By way of summation and review, when blue light is transmitted as it is through a color conversion element, a viewing angle (white angular dependency, WAD) for blue light may be reduced. Further, when the purity of the blue light itself emitted from the light source is low, the color purity of the blue color viewed through the color conversion element may also be lowered. However, when a scattering agent or a separate blue filter is provided in a region expressing the blue color in the color conversion element in order to improve the viewing angle or color purity of the blue light, luminance of the light emitted through the scattering agent or the color filter may be lowered.

In contrast, according to embodiments, a color conversion element is provided, which can set a balance between luminance and a viewing angle or color purity for a specific color to a desired level, and a display device including the same. That is, as described above, a region of a color conversion element expressing a specific, e.g., blue, color is provided with only as many filter layers as necessary, thereby setting a balance between luminance and a viewing angle or color purity for a specific color to a desired level. The effects of the present disclosure are not limited by the foregoing, and other various effects are anticipated herein.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A color conversion element, comprising:
a base substrate; and
a first color filter layer, a second color conversion layer, and a third color conversion layer disposed on the base substrate,
wherein the first color filter layer, the second color conversion layer, and the third color conversion layer are sequentially arranged on a plane,
wherein an interval between the first color filter layer and the second color conversion layer or an interval between the first color filter layer and the third color conversion layer is different from an interval between the second color conversion layer and the third color conversion layer, and
wherein the first color filter layer, the second color conversion layer, and the third color conversion layer correspond to regions emitting first, second, and third colors, respectively, the first, second, and third colors being blue, green, and red colors, respectively.

2. The color conversion element as claimed in claim 1, wherein the first color filter layer includes a scattering agent.

3. The color conversion element as claimed in claim 1, wherein the first color filter layer includes at least one of a pigment having a first color and a dye having the first color.

4. A color conversion element, comprising:
a base substrate; and
a first color filter layer, a second color conversion layer, and a third color conversion layer disposed on the base substrate,
wherein the first color filter layer, the second color conversion layer, and the third color conversion layer are sequentially arranged on a plane,
wherein an interval between the first color filter layer and the second color conversion layer or an interval between the first color filter layer and the third color conversion layer is different from an interval between the second color conversion layer and the third color conversion layer, and
wherein the second color conversion layer and/or the third color conversion layer includes:
a first color cutting layer; and
a color conversion medium layer on the first color cutting layer.

5. The color conversion element as claimed in claim 4, wherein the color conversion medium layer includes a quantum dot.

6. The color conversion element as claimed in claim 1, wherein an area size of the first color filter layer overlapping the base substrate is different from an area size of the second color conversion layer or the third color conversion layer overlapping the base substrate.

7. The color conversion element as claimed in claim 1, wherein an area size of the first color filter layer contacting the base substrate is different from an area size of the second color conversion layer or the third color conversion layer contacting the base substrate.

8. A color conversion element, comprising:
a base substrate; and
a first color filter layer, a second color conversion layer, and a third color conversion layer disposed on the base substrate,
wherein the first color filter layer, the second color conversion layer, and the third color conversion layer are sequentially arranged on a plane,
wherein an interval between the first color filter layer and the second color conversion layer or an interval between the first color filter layer and the third color conversion layer is different from an interval between the second color conversion layer and the third color conversion layer, and
wherein a part of the first color filter layer is on the second color conversion layer to overlap a part of the second color conversion layer.

9. The color conversion element as claimed in claim 1, further comprising a light blocking member among the first color filter layer, the second color conversion layer, and the third color conversion layer.

* * * * *